United States Patent
Jasa et al.

(10) Patent No.: US 10,200,054 B1
(45) Date of Patent: Feb. 5, 2019

(54) ADAPTIVE DYNAMIC ELEMENT MATCHING OF CIRCUIT COMPONENTS

(71) Applicant: SEMICONDUCTOR COMPONENTS INDUSTRIES, LLC, Phoenix, AZ (US)

(72) Inventors: Hrvoje Jasa, Scarborough, ME (US); Tyler Daigle, Scarborough, ME (US); Andrew Jordan, Scarborough, ME (US); Gregory Maher, Cape Elizabeth, ME (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/869,757

(22) Filed: Jan. 12, 2018

(51) Int. Cl.
| | |
|---|---|
| *H03M 1/66* | (2006.01) |
| *H03M 1/06* | (2006.01) |
| *H03M 3/00* | (2006.01) |
| *H03M 1/74* | (2006.01) |
| *H04B 15/02* | (2006.01) |

(52) U.S. Cl.
CPC ....... *H03M 1/0665* (2013.01); *H03M 1/0673* (2013.01); *H03M 1/664* (2013.01); *H03M 1/74* (2013.01); *H03M 3/464* (2013.01); *H03M 3/502* (2013.01); *H04B 15/02* (2013.01)

(58) Field of Classification Search
CPC ...... H03M 1/0665; H03M 1/74; H03M 3/502; H03M 1/0673; H04B 15/02
USPC .................................................. 341/144, 120
See application file for complete search history.

(56) References Cited

U.S. PATENT DOCUMENTS

| | | | | |
|---|---|---|---|---|
| 7,538,707 | B2* | 5/2009 | Sakurai | H03M 1/0665 341/144 |
| 7,719,455 | B2* | 5/2010 | Kim | H03M 1/0665 341/118 |
| 8,643,525 | B1* | 2/2014 | Wen | H03M 1/067 341/144 |
| 9,762,256 | B2* | 9/2017 | Chandra | H03M 1/066 |
| 2003/0067404 | A1 | 4/2003 | Ruha et al. | |
| 2015/0023455 | A1 | 1/2015 | Shibata et al. | |

OTHER PUBLICATIONS

Hanjun Jiang, et al., A Deterministic Dynamic Element Matching Approach for Testing High Resolution ADCs Using Low Accuracy DACs (Design No. 68091), Design Report for MOSIS Educational Program (Research), Dept. of Electrical and Computer Engineering, Iowa State University, May 3, 2004.

* cited by examiner

*Primary Examiner* — Brian Young
(74) *Attorney, Agent, or Firm* — Brake Hughes Bellermann LLP

(57) ABSTRACT

In a general aspect, an apparatus can include a signal analyzer configured to analyze a signal associated with a processing pipeline, and a dynamic element matching (DEM) selection module configured to select a DEM algorithm from a plurality of DEM algorithms based on the analysis performed by the signal analyzer. The apparatus can include a set of circuit elements where each circuit element from the set of circuit elements has the same logical configuration, and a circuit element selection module configured to select a subset of the set of circuit elements based on the selected DEM algorithm.

19 Claims, 12 Drawing Sheets

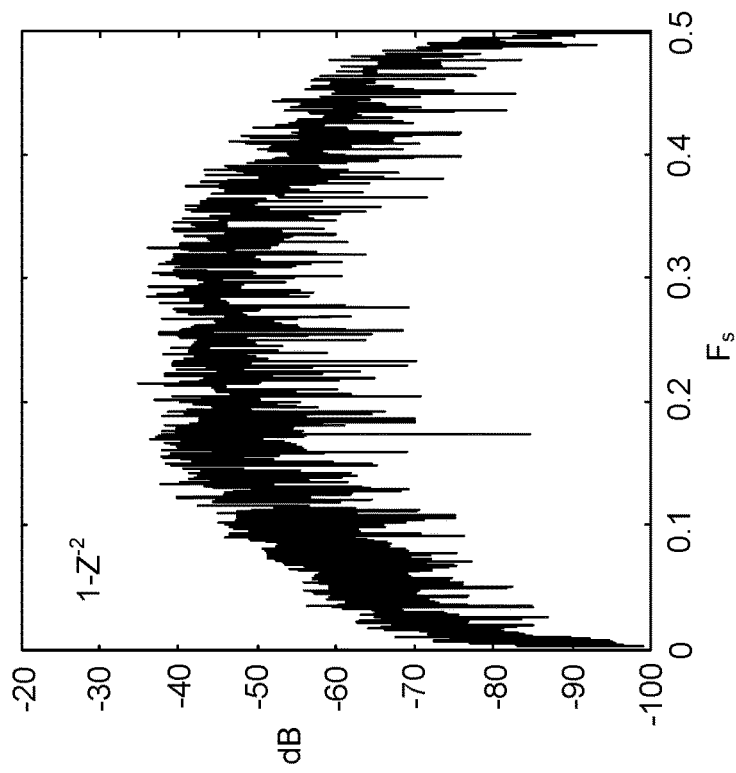
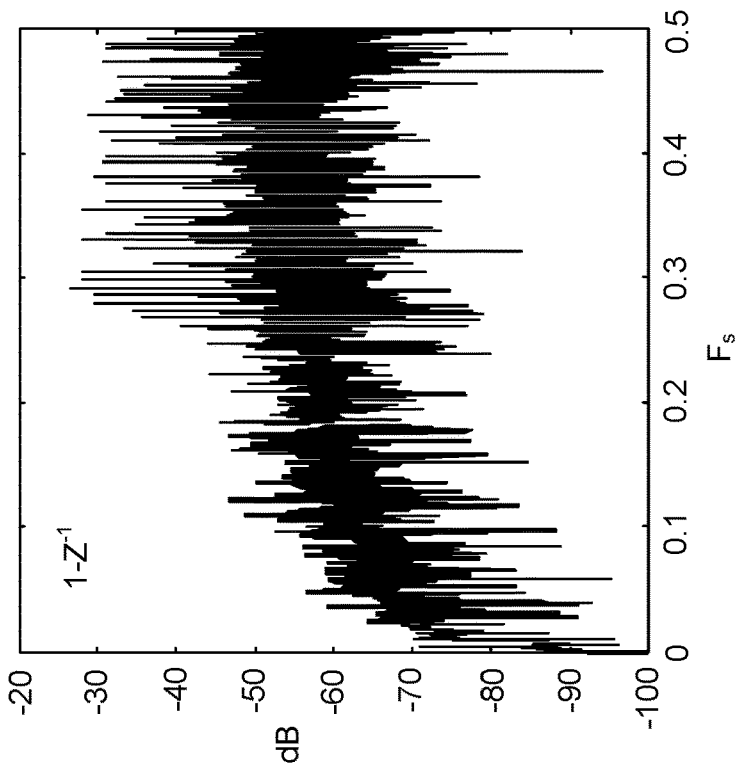
FIG. 6B
FIG. 6A

ADAPTIVE DYNAMIC ELEMENT MATCHING OF CIRCUIT COMPONENTS

TECHNICAL FIELD

This description relates to adaptive dynamic element matching of circuit components within an audio hardware system.

BACKGROUND

Multiple circuit elements manufactured in, for example, silicon can be included in a pipeline of, for example, an audio system configured to produce sound. The audio system can be a hardware system including multiple components such as a speaker, a housing, a hardware processor, etc. Unmatched characteristics of the multiple circuit elements due to, for example, manufacturing variations can result in undesirable noise in an audio signal produced by the speaker of the system when the multiple circuit elements are used to process a signal within the audio system. Thus, a need exists for systems, methods, and apparatus to address the shortfalls of present technology and to provide other new and innovative features.

SUMMARY

In a general aspect, an apparatus can include a signal analyzer configured to analyze a signal associated with a processing pipeline, and a dynamic element matching (DEM) selection module configured to select a DEM algorithm from a plurality of DEM algorithms based on the analysis performed by the signal analyzer. The apparatus can include a set of circuit elements where each circuit element from the set of circuit elements has the same logical configuration, and a circuit element selection module configured to select a subset of the set of circuit elements based on the selected DEM algorithm.

BRIEF DESCRIPTION OF THE DRAWINGS

FIGS. 6A and 6B are graphs that illustrate the behavior of an example DEM algorithm.

DETAILED DESCRIPTION

Figure 1:
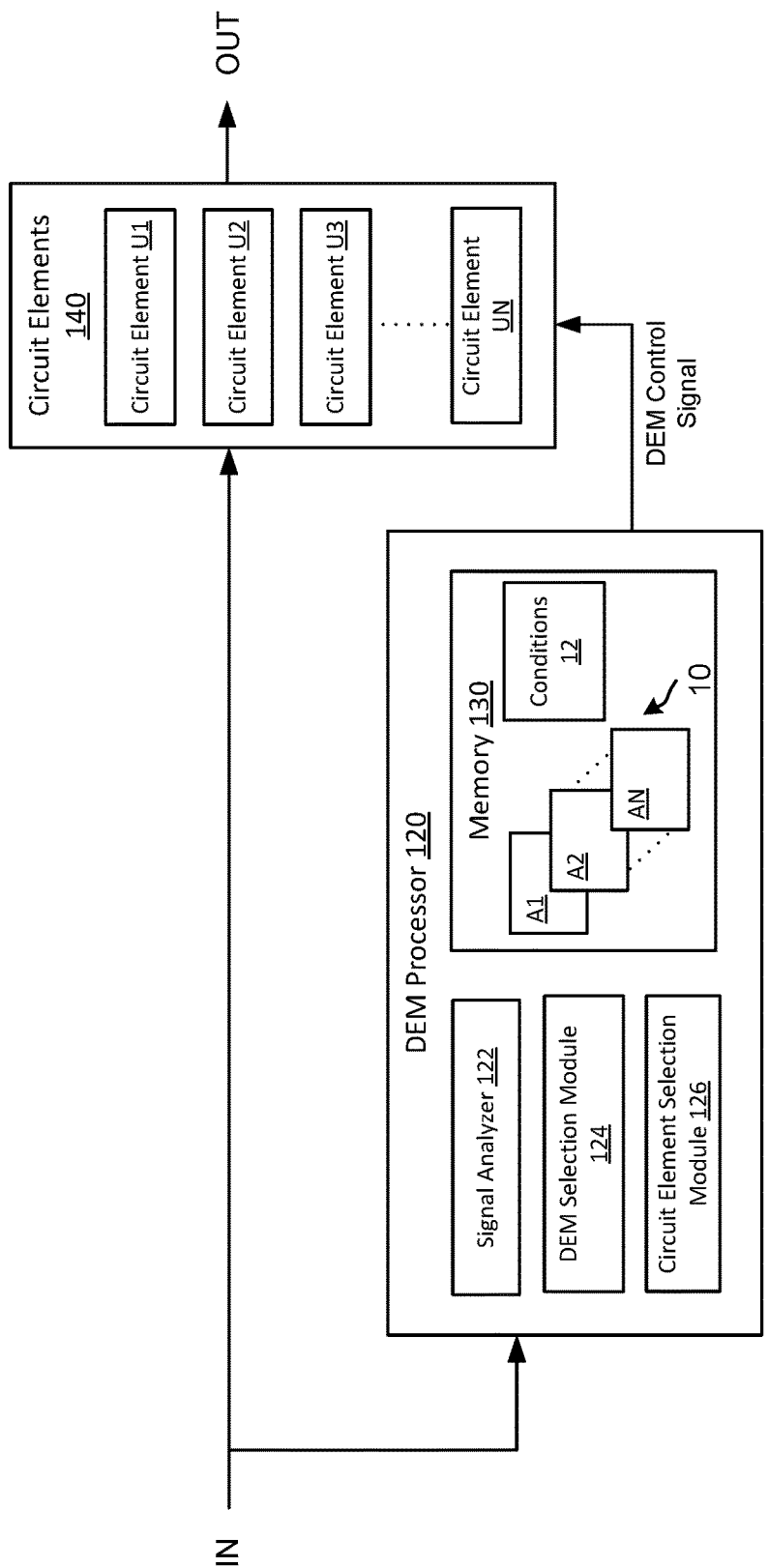
FIG. 1 illustrates an example dynamic element matching (DEM) processor configured to control circuit elements, according to an implementation.

In a signal processing pipeline, a set of circuit elements within a portion of the signal processing pipeline can be used to process an input signal (or a derivative thereof) to produce an output signal. In some implementations, each of the circuit elements can be referred to as a processing unit, a processing element, or as a quanta. In some implementations, the signal processing pipeline (of a digital signal processor DSP)) can include, for example, an analog-to-digital (AD) or digital-to-analog (DA) conversion processing pipeline. In some implementations, the signal processing pipeline can be associated with, for example, audio signal processing.

The set of circuit elements within the signal processing pipeline can be configured so that each circuit elements from the set of circuit elements is an identical instance of each of the other circuit elements from the set. Even though each of the circuit elements is configured as an identical instance, because of mismatches (also can be referred to as variations) due to, for example, manufacturing variations, environmental factors, etc., at least some of the circuit elements can function in a different (e.g., slightly different) fashion from other of the circuit elements. In other words, even though all of the circuit elements from the set of circuit elements have an identical configuration, at least some of the set of circuit elements can vary slightly in functionality, in practice (e.g., when implemented in hardware), as compared with other of the set of circuit elements. These slight mismatches between the circuit elements can result in an error (e.g., random errors, signal processing noise, non-linearities, etc.) when processing a signal. Especially when using multiple circuit elements, errors can be compounded when processing the signal.

As a specific example, each circuit element from a set of circuit elements within a DAC can be the same instance of a current source. Multiple of the current sources can be additively used to produce an analog signal of a magnitude from a portion of a digital signal. If the current sources are mismatched (due to, for example, manufacturing variations), the magnitude of the analog signal may be incorrect (e.g., slightly high or slightly low). The dynamic element matching (DEM) processor (and components thereof), as described herein, can be used to select a DEM algorithm that reduces (e.g., minimizes) error caused by the mismatches of the current sources.

If the DAC described above is used in an audio processing context, the DEM processor can reduce, for example, noise in an analog audio signal that is produced using the multiple current sources. Specifically, the DEM processor can be configured to adaptively select DEM algorithms that implement the current sources in the DAC so that, for example, noise in the analog audio signal is reduced.

In some implementations, because of the mismatches (e.g., variations) between circuit elements from the set of circuit elements, the DEM processor can be configured to select subsets of the multiple circuit elements to process the input signal based on a DEM algorithm selected from a library of DEM algorithms. The DEM algorithms can each be configured to reduce the effects of mismatches between circuit elements. Each of the DEM algorithms from the library of DEM algorithms can be configured to use the set of circuit elements in a specified way (e.g., specified selection order, specified selection scheme) to mitigate mismatch issues while processing the input signal.

In some implementations, a DEM processor that can adaptively select DEM algorithms can have desirable benefits when processing a signal within, for example, a DSP. Adaptively switching between DEM algorithms based on, for example, signal statistics can result in desirable overall output results from a set of circuit elements. In an audio signal processing context, for example, the DEM processor can be configured to adaptively select a DEM algorithm that has desirable (e.g., low) noise floor characteristics in some scenarios and can be configured to adaptively select another DEM algorithm that exhibits desirable harmonic/tonal performance in other scenarios. DEM algorithms can be evaluated for noise floor characteristics, for example, at low signal levels (e.g., low amplitude levels, zero), and harmonic distortion performance can be characterized at, for example, high signal levels (e.g., high amplitude levels). Accordingly, the DEM processor, can improve the functioning of, for example, a DSP by adaptively selecting the DEM algorithm that reduces undesirable output results.

FIG. 1 illustrates an example DEM processor 120 configured to control (e.g., select) a set of circuit elements 140, according to an implementation. As shown in FIG. 1, the set of circuit elements 140 can be configured to receive an input signal IN and produce an output signal OUT. The DEM processor 120 is configured to select all or a subset of the circuit elements included in the set of circuit elements 140 for processing the input signal IN to produce the output signal OUT.

The set of circuit elements 140 can be configured so that each circuit element (labeled U1 through UN) of the set of circuit elements is an identical instance (e.g., identical layout, same configuration, matched) of each of the other circuit elements 140 from the set. In other words, each of the set of circuit elements can have the same configuration for processing, same layout, same processing, and/or so forth. For example, circuit element U1 can be identical or equivalent in configuration to circuit element U2, and circuit element U2 can be identical in configuration to circuit element UN. The circuit elements 140 can be used, for example, in a thermometer weighting scheme, where each of the circuit elements 140 has the same or equivalent weight.

The set of circuit elements 140, even though they are each identical instances, can each include a variety of elements. In some implementations, the set of circuit elements 140 can include, for example, a voltage source, a current source, a comparator, a current mirror, a resistor, a capacitor, a logical element including a logic gate (e.g., a NAND gate, an AND gates, an XOR gate), and/or so forth. For example, each of the set of circuit elements 140 can include a current source, a comparator, and the same logical configuration.

Even though each of the circuit elements 140 is configured as an identical instance, because of mismatches caused by, for example, manufacturing variations, environmental factors, etc. (which can be collectively or individually referred to as variations) at least some of the circuit elements 140 can function in a slightly different fashion from other of the circuit elements 140. For example, even though each of the circuit elements 140 are configured (e.g., has a configuration) to produce a current of 1.0 mA in response to an input, circuit element U1 may produce 0.9999 mA in response to the input and circuit element UN may produce 1.0001 mA in response to the same input.

Mismatches between the circuit elements 140 can result in variety of issues manifested in the output signal OUT including errors such as, for example, random errors, non-linearities, distortion, signal processing noise, etc. The mismatches between the circuit elements 140 can be additive (or multiplicative) when multiple of the circuit elements 140 are used, for example, to process parts of a signal in parallel. For example, an error in circuit element U1 to process a first part of a signal can be additive to an error in circuit element U2 to process a second part of the signal. In some implementations, errors introduced by mismatches between circuit elements 140 can be magnified when the output signal OUT is amplified, is used in high dynamic range processing, is otherwise subject to high gain processing, and/or so forth.

Even though, in theory, the DEM processor 120 could select any combination of the circuit elements 140 to produce the output signal OUT because they are equivalently configured, in practice, the DEM processor 120 controls the circuit elements 140 taking into account the possibility of mismatches between the equivalently configured circuit elements 140. Specifically, the DEM processor 120 is configured to select a DEM algorithm from a library of DEM algorithms 10 (including DEM algorithms A1 through AN) based on analysis of the input signal IN. The library of DEM algorithms 10 can be referred to as DEM algorithms or as DEM algorithms A.

Each of the DEM algorithms 10 can be configured to trigger selection of the circuit elements 140 such that errors associated with each of the circuit elements 140 due to mismatches (e.g., caused by manufacturing variation) are reduced (e.g., statistically reduced, reduced over). Said differently, each of the DEM algorithms from the library of DEM algorithms 10 can be configured to use the set of circuit elements 140 in a different way to process the input signal IN. For example, DEM algorithm A1 can be configured to select a first subset of the circuit elements 140 and thereby reduce an error induced by a particular type of mismatch when processing input signal IN. DEM algorithm A2 can be configured to select a second subset (different from the first subset) of the circuit elements 140 and thereby reduce an error induced by a particular type of mismatch when processing input signal IN. A specific example illustrating selection of circuit elements is illustrated and described in more detail in connection with FIGS. 10A through 10C.

In some implementations, one or more of the DEM algorithms 10 can be configured to move errors from a first part of a signal (e.g., a relatively important part of a signal) to a second part of the signal (e.g., a relatively less important part of the signal). For example, a DEM algorithm can be configured to spectrally move errors (e.g., move errors within a frequency spectrum) from an in-band portion of a signal (e.g., an audio signal) to an out-of-band portion of the signal (or frequency spectrum of the signal). In the audio context, for example, errors that can be manifested by the circuit elements 140 can be moved to a high frequency portion (e.g., greater than 20 kHz) of an audio signal where they may not be perceived by a human listening to the audio signal.

In some implementations, one or more of the DEM algorithms 10 can be based on an equation (e.g., a linear equation, a non-linear equation). An example of a DEM algorithm based on an equation is described in connection with at least FIGS. 6A through 11C. In some implementations, one or more of the DEM algorithms 10 can be based on random selection, a logical structure or network, an empirical formula, and/or so forth. In some implementations, a DEM algorithm can be implemented in hardware and/or software. In some implementations, the DEM algorithms 10 can each be relatively low power (e.g., low power consumption) and/or relatively small area (when implemented in hardware) while still providing desirable performance.

As shown in FIG. 1, the DEM processor 120 includes a signal analyzer 122, a DEM selection module 124, and a circuit element selection module 126. These components of the DEM processor 120 can be configured to collectively select one or more of the DEM algorithms 10 that can be used to trigger processing of the input signal IN by the circuit elements 140.

In general, the components of the DEM processor 120 can function as follows. The signal analyzer 122 can be configured to analyze the input signal IN. Based on the analysis performed by the signal analyzer 122, the DEM selection module 124 of the DEM processor 120 can be configured to select at least one of the DEM algorithms from the library of DEM algorithms 10 that would be desirable for processing the input signal IN. The circuit element selection module 126 can be configured to then select (or trigger selection of) a subset of the set of circuit elements based on the selected DEM algorithm. For example, the signal analyzer 122 can be configured to analyze the input signal IN and the DEM selection module 124 can be configured to select DEM algorithm A1 for processing the input signal IN based on the analysis. The circuit element selection module 126 can be configured to then trigger selection of circuit elements U1 and U3 based on DEM algorithm A1.

In some implementations, the signal analyzer 122 can be configured to analyze one or more characteristics of the input signal IN such as an amplitude of the signal (e.g., a signal level), a signal frequency (e.g., signal frequency content), and/or so forth. In some implementations, the signal analyzer 122 can be configured to calculate one or more statistical values (e.g., a mean, an average (e.g., a moving window average), a maximum, a minimum, rate of change) related to the input signal IN. The one or more of the statistical values can be related to one or more of the characteristics noted above.

In some implementations, other characteristics that are not directly related to processing of the input signal IN (e.g., non-signal related characteristics) can be used for selection of a DEM algorithm(s) 10. For example, the characteristics can include, for example a temperature of a circuit (e.g., temperature of a portion of a processing pipeline), a circuit type (e.g., a DAC, an ADC), a usage mode of the circuit (e.g., use in a particular application), etc.

In some implementations, one or more of the DEM algorithms 10 can have a region where performance (e.g., reduction of errors) is ideal for a particular signal statistic (e.g., characteristic) signature. In some implementations, one or more of the DEM algorithms 10 can have a region where performance can be undesirable for a particular signal statistic. The DEM algorithm(s) 10 can be selected based on where performance would be desirable based on the characteristics (e.g., statistics of a particular characteristic). These selections based on desirable or undesirable performance can be implemented using conditions, which are described below.

The DEM selection module 124 can be configured select one or more of the DEM algorithms 10 based on the analysis by the signal analyzer 122 and one or more conditions 12 (also can be referred to as DEM conditions or as statistical conditions). The conditions 12 can include, for example, a threshold value, a logical condition (e.g., an AND condition, an XOR condition), and/or so forth. The DEM selection module 124 can select one of the DEM algorithms 10 based on a comparison one or more of the characteristics and/or statistical values produced by the signal analyzer 122 with one or more of the conditions 12. In other words, the DEM selection module 124 can select at least one of the DEM algorithms 10 based on one or more of the characteristics and/or statistical values produced by the signal analyzer 122 satisfying at least one of the conditions 12.

As a specific example, the DEM selection module 124 can be configured to select one of the DEM algorithms 10 based on a characteristic matching a characteristic indicated for selecting the one DEM algorithm (as specified within one of the conditions 12). As another specific example, the DEM selection module 124 can be configured to select one of the DEM algorithms 10 based on a statistical value of one of the characteristics of the input signal IN exceeding or falling below a threshold value (as specified within one of the conditions 12).

The circuit element selection module 126 is configured to implement the DEM algorithm selected by the DEM selection module 124. In some implementations, the circuit element selection module 126 is configured to produce and send a DEM control signal to select the circuit elements 140 (or a subset thereof) based on one of DEM algorithms selected by the DEM selection module 124.

In some implementations, the DEM processor 120 can be configured to adaptively select DEM algorithms from the library of DEM algorithms 10 based on analysis of the input signal INT at different times (or during different time frames). In some implementations, the DEM processor 120 can be configured to adaptively select DEM algorithms from the library of DEM algorithms 10 based on changes in analysis of the input signal INT over time.

For example, the DEM processor 120 can be configured to select a first DEM algorithm from the library of DEM algorithms 10 based on an analysis of the input signal INT at a first time (or during a first time frame), and can be configured to select a second DEM algorithm (different from the first DEM algorithm) from the library of DEM algorithms 10 based on an analysis of the input signal INT at a second time (or during a second time frame). In this way, the library of DEM algorithms 10 can be used to process the input signal INT in a desirable fashion at each of the various processing times (e.g., processing time frames).

In some implementations, the DEM processor 120 can be configured to adaptively select DEM algorithms from the library of DEM algorithms 10 in real-time. In other words, one or more DEM algorithm 10 can be selected and used for processing of the input signal IN (using the circuit elements 140) as the input signal IN is being received. Prior characterization of the circuit elements 140 for handling the input signal IN is not needed or can be eliminated because processing by the DEM processor 120 can be executed while the input signal IN is being received.

In some implementations, the DEM control signal can be considered a feedforward signal (or can be part of a feedforward path including the DEM processor 120). In this implementation, the DEM control signal can be produced by the DEM processor 120 based on a portion of the input signal IN (which can also be part of a feedforward path). In some implementations, the DEM control signal can be sent to the circuit elements 140 in a timely fashion for processing of the input signal IN. In other words, a portion of the input signal IN that is used to produce the DEM control signal can be processed at the circuit elements 140 in response to the DEM control signal. In some implementations, the portion of the input signal IN can be delayed by other processing (within a processing pipeline) before being processed at the circuit elements 140. A signal processing pipeline implementation is shown and described in connection with at least FIGS. 3 and 4.

Figure 2:
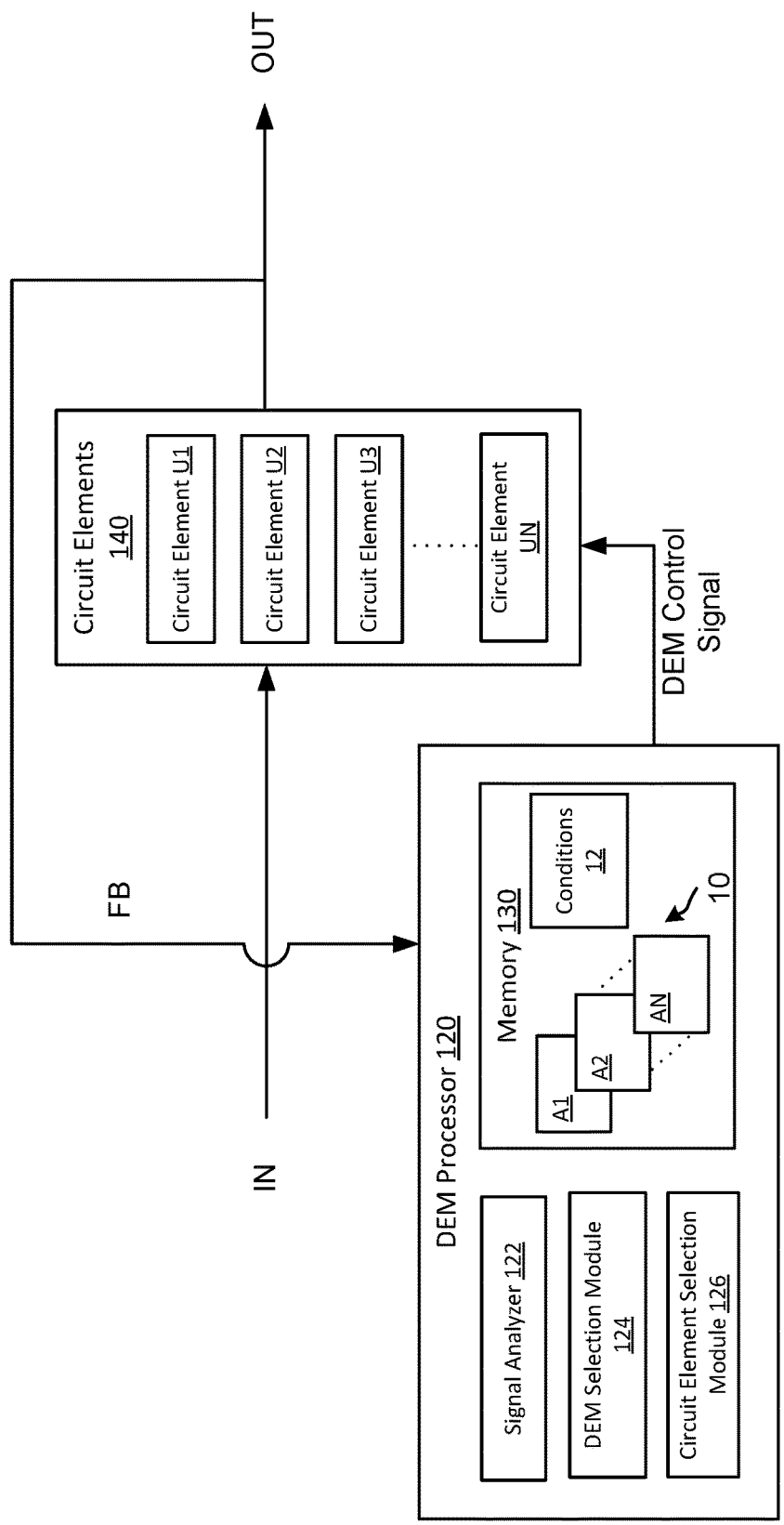
FIG. 2 illustrates a variation of the implementation shown in FIG. 1 including a feedback signal.

FIG. 2 illustrates a variation of the implementation shown in FIG. 1 including a feedback signal FB. As shown in FIG. 2, the DEM processor 120 can be configured to receive a feedback signal FB from the output of the circuit elements 140. For example, at least a portion of the output signal OUT can be received by the DEM processor 120 as a feedback signal FB. Accordingly, in such implementations, the DEM processor 120 (e.g., the signal analyzer 122, the DEM selection module 124, the circuit element selection module 126) can use the feedback signal FB to adaptively select one or more of the DEM algorithms 10.

Although not shown in FIG. 1 or 2, both feedback signal FB processing and feedforward signal processing (e.g., with the DEM control signal shown in FIG. 1 being considered a feedforward signal) can be utilized by a DEM processor 120 (in an implementation) to select (and implement) one or more of the DEM algorithms 10. For example, in some implementations, feedback signal FB could be used in conjunction with the feedforward signal (as shown in FIG. 1) to refine (e.g., modify, change) a selection by the DEM processor 120 using the feedforward signal.

In some implementations, the feedback signal FB and the feedforward signal can be different types of signals. For example, the feedback signal FB can be an analog signal and the feedforward signal can be a digital signal (or vice versa).

Referring back to FIG. 1, in some implementations, the functionality of the components can be included in different modules and/or different components than those shown. In some implementations, the functionality and processing of the components of the DEM processor 120 can be distributed to several components of a signal processing pipeline. Such signal processing pipeline implementations are described in connection with at least FIGS. 3 and 4.

In some implementations, the DEM processor 120 (or portion thereof) can be, or can include, a variety of circuit types. For example, the DEM processor 120 can be a microprocessor, a logic module, a digital signal processor (DSP), a logic gate, an application-specific integrated circuit (ASIC), a field programmable gate array (FPGA), and/or so forth. In some embodiments, the DEM processor 120 can be, or can include, any combination of a digital circuit and an analog circuit.

In some implementations, the components (e.g., modules, analyzers) of the DEM processor 120 can be configured to operate based on one or more platforms (e.g., one or more similar or different platforms) that can include one or more types of hardware, software, firmware, operating systems, runtime libraries, and/or so forth. The components of the DEM processor 120 can be, or can include, any type of hardware and/or software configured to process attributes. In some implementations, one or more portions of the components shown in the components of the DEM processor 120 described herein can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the DEM processor 120 can be, or can include, a software module configured for execution by at least one processor (not shown). In other words, one or more of the components of the DEM processor 120 can be, or can include, processors configured to process instructions stored in a memory.

In some implementations, the memory 130 can be any type of memory such as a random-access memory, a disk drive memory, flash memory, and/or so forth. In some implementations, the memory 130 can be implemented as more than one memory component (e.g., more than one RAM component or disk drive memory) associated with the components of the DEM processor 120. In some implementations, the memory 130 can be, or can include, a non-local memory. For example, the memory 130 can be, or can include, a memory shared by multiple devices (not shown).

Figure 3:
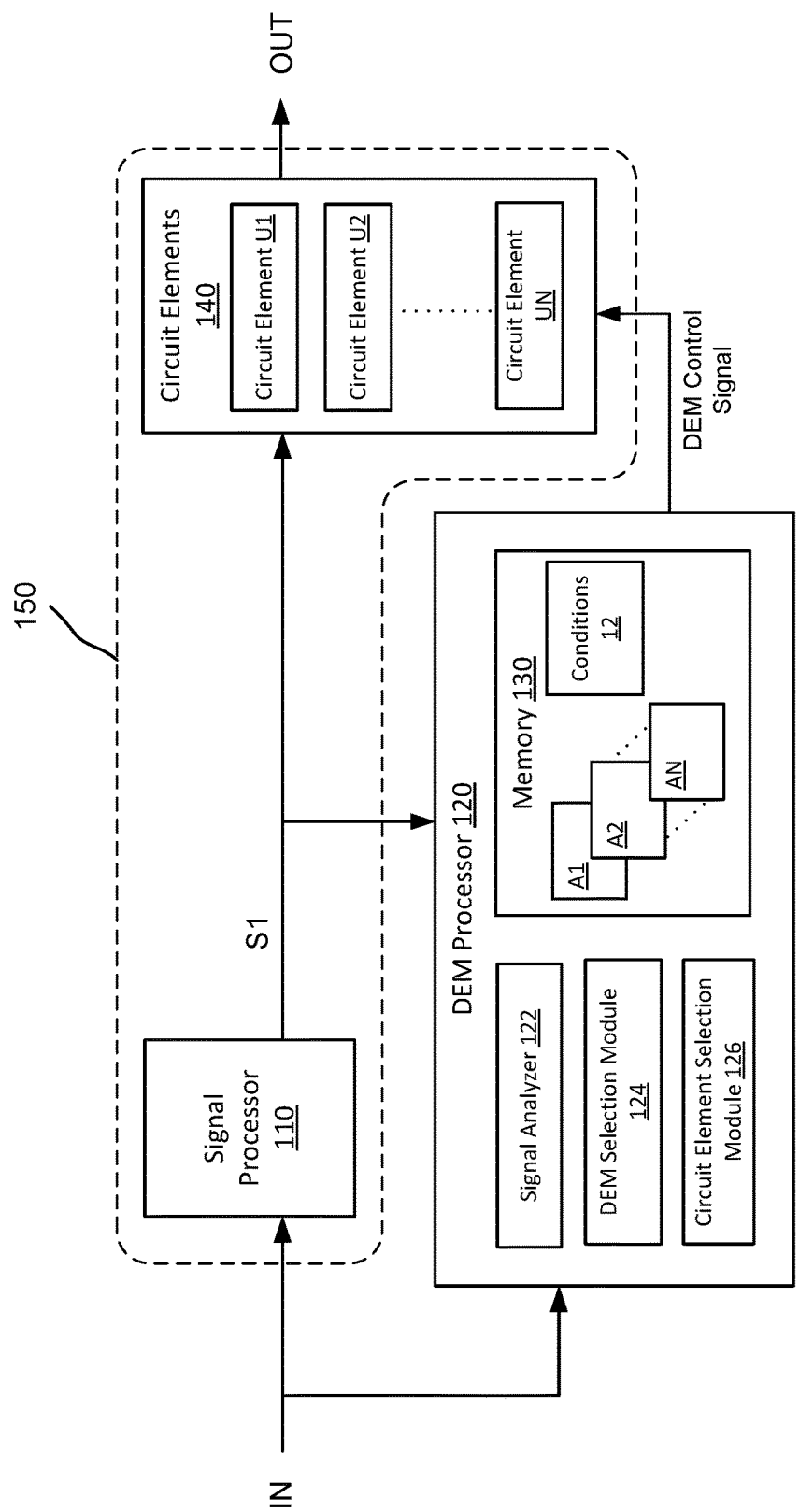
FIG. 3 illustrates the DEM processor configured to control circuit elements associated with a signal pipeline, according to an implementation.

FIG. 3 illustrates the DEM processor 120 configured to control circuit elements associated with a signal pipeline 150, according to an implementation. The signal processing pipeline 150 includes a signal processor 110 and circuit elements 140. The signal processor 110 is configured to process (e.g., receive) the input signal IN and produce an intermediate signal S1. The intermediate signal S1 is processed by the circuit elements 140 and used to produce the output signal OUT.

As shown in this implementation, the DEM processor 120 is configured to select and implement one or more of the DEM algorithms 10 based on the input signal IN and the intermediate signal S1. Specifically, the signal analyzer 122 can be configured to analyze the signals IN, S1. Based on the analysis performed by the signal analyzer 122, the DEM selection module 124 of the DEM processor 120 can be configured to select at least one of the DEM algorithms from the library of DEM algorithms 10 that would be desirable for the signal processing pipeline 150 to process the input signal IN and produce the output signal OUT. Although not shown in FIG. 3, a feedback signal could also be used by (instead of, or in connection with the signals already processed by) the DEM processor 120. In some implementations, the intermediate signal S1 may alone be used (without the input signal IN) by the DEM processor 120 to produce the DEM control signal.

The signal processing pipeline 150, in this example implementation, is generically shown to represent generic components that can be used in conjunction with a DEM processor 120. In some implementations, one or more of the components of DEM processor 120 can be included in, for example, the signal processor 110.

The signal processor 110 in this example implementation can represent, or can be, any type of signal processor 110 configured to process a signal. The signal processor 110 can include one or more modules, circuits, etc. In some implementations, the signal processing pipeline 150 can include a variety of signal processing components. For example, the signal processing pipeline 150 can be or include a digital-to-analog conversion (DAC) processing pipeline or an analog-to-digital conversion (ADC) processing pipeline. In some implementations, the signal processing pipeline 150 can be associated with, for example, audio signal processing. An example of the DEM processor 120 included in a DAC processing pipeline is shown and described in at least FIG. 4.

Figure 4:
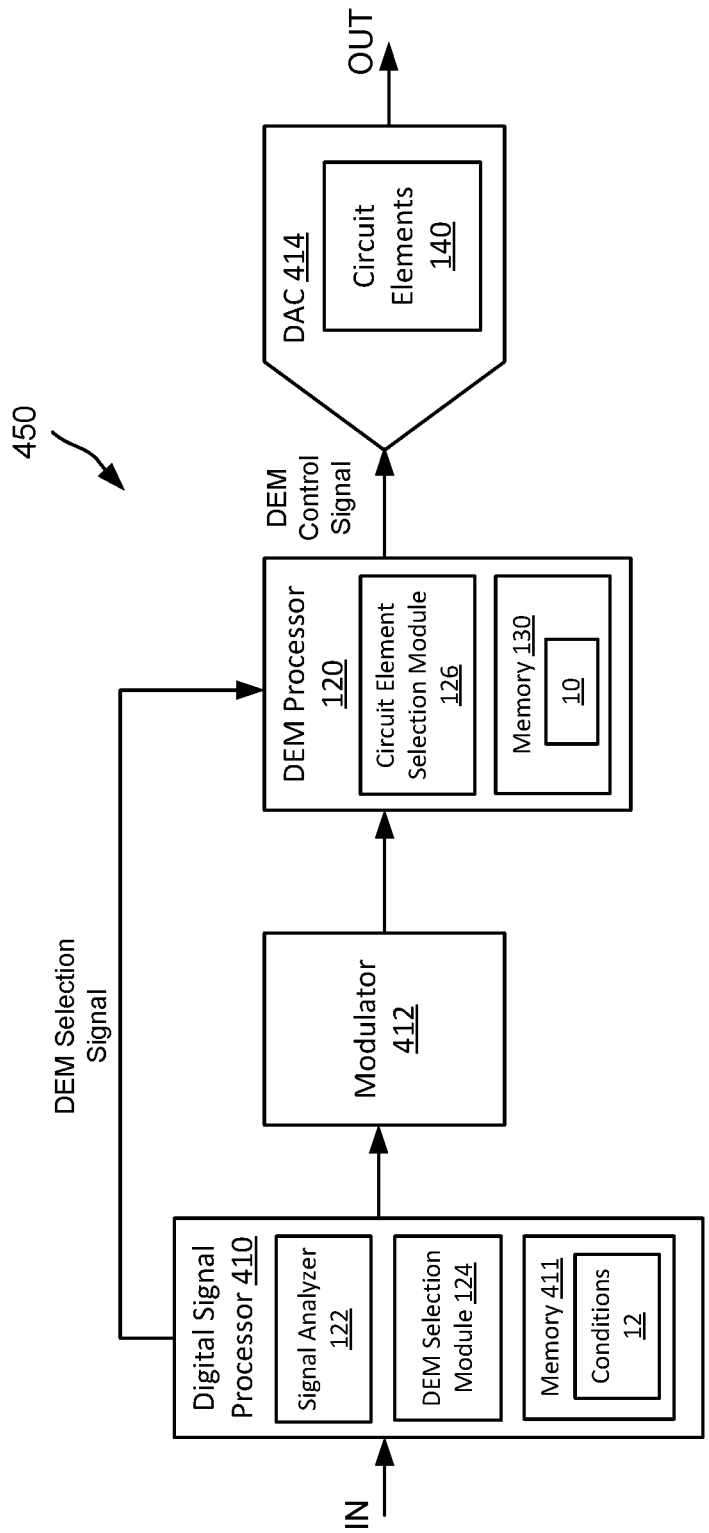
FIG. 4 is a diagram that illustrates a signal processing pipeline of a digital-to-analog converter (DAC) including a DEM processor.

FIG. 4 is a diagram that illustrates a signal processing pipeline 450 of a DAC (can be referred to as a DAC pipeline) including a variation of the DEM processor 120 described above. The DAC pipeline 450 includes a digital signal processor (DSP) 410, a modulator 412 (e.g., sigma-delta modulator), the DEM processor 120, and a DAC converter 414. It is noted that the signal analyzer 122 and the DEM selection module 124, rather than being included in the DEM processor 120, are included in the DSP 410. A memory 411 included in the DSP 410 stores the conditions 12, which can be accessed by the DEM selection module 124.

Because errors in the circuit elements 140 (e.g., unit elements) of the DAC 414 can manifest themselves as non-linearities in the digital-to-analog conversion cycle (e.g., a conversion cycle along the DAC pipeline 450) the DEM processor 120 (and DEM algorithm selection process) are implemented. A conversion (at the DAC 414) can include a summation of values produced by the circuit elements 140. Non-linearities can be manifested as, for example, an increase in a noise floor and/or harmonic distortion. More details regarding noise floor and harmonic distortion are described in connection with the figures below.

The signal analyzer 122 in the DSP 410 can determine one or more characteristics (e.g., aspects) of the input signal IN such as an amplitude of the signal (e.g., a signal level), a signal frequency (e.g., signal frequency content), and/or so forth. The signal analyzer 122 can be configured to calculate one or more statistical values (e.g., a mean, an average (e.g., a moving window average), a maximum, a minimum) related to the input signal IN. The DEM selection module 124 can be configured select one or more of the DEM algorithms 10 (and send a DEM selection signal) based on the analysis by the signal analyzer 122 and one or more of the conditions 12. The circuit element selection module 126 is configured to produce and send a DEM control signal to the DAC 414 to select the circuit elements 140.

In some implementations, the DSP 410 can be configured to serially receive the input signal IN. The DSP 410 can be configured to convert the serial data into parallel data (e.g., an n-bit word (e.g., 20-bit word, 8-bit word)) that can be processed through the DAC pipeline 450. Although not shown in FIG. 4, the output of the DAC pipeline 450 can be, for example, an amplifier (to drive a speaker), a speaker, and/or so forth.

Although not shown, multiple different clock signals can be associated with the DSP 410. A master clock MCLK can be used as the primary clock for the DAC pipeline 450, an LR clock can be used to define a sample rate, a bit clock BCLK can be used to clock in digital data serially, and/or so forth.

Although not shown in FIG. 4, a feedback signal can be included on the output of the DAC 414. In some implementations, the feedback signal can be used to sense a speaker load on the output of the DAC 414. The feedback signal can be provided to the DSP 410 (and the signal analyzer 122) for selection of a DEM algorithm.

Figure 5:
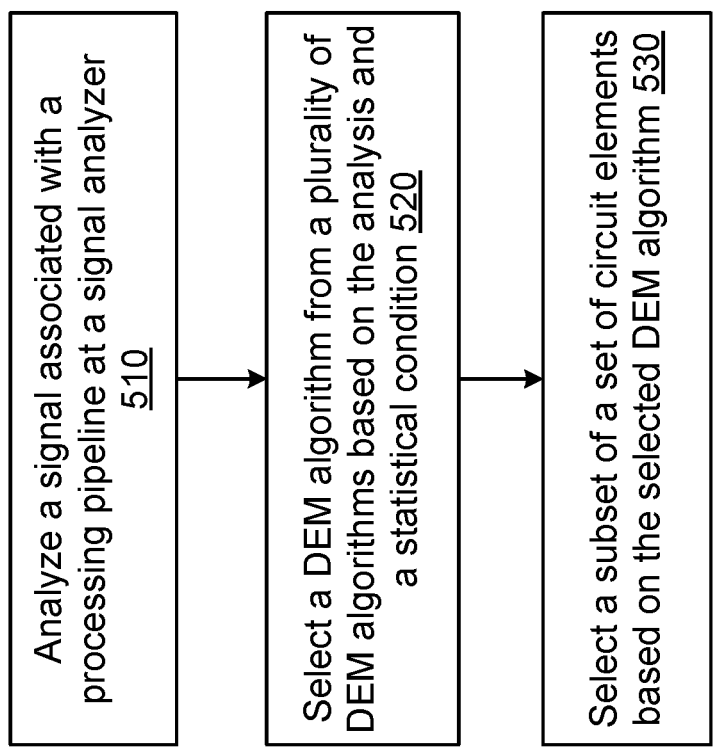
FIG. 5 is a flowchart that illustrates a method for selecting a DEM algorithm using a DEM processor.

FIG. 5 is a flowchart that illustrates a method for selecting a DEM algorithm using a DEM processor (e.g., DEM processor 120). As shown in FIG. 5, the method can include analyzing a signal associated with a processing pipeline at a signal analyzer (block 510). The processing pipeline can be associated with processing of an audio signal. In some implementations, the signal can be a feedforward signal associated with an input side of the processing pipeline. In some implementations, the signal can be a feedback signal associated with an output side of the processing pipeline.

The method can include selecting a DEM algorithm from a plurality of DEM algorithms based on the analysis and a statistical condition (block 520). The statistical condition can be associated with a signal level, signal frequency content, and/or so forth.

The method can also include selecting a subset of a set of circuit elements based on the selected DEM algorithm (block 530). Each of the set of circuit elements can be equivalently configured. In some implementations, the DEM algorithm can be implemented as an equation (e.g., a transfer function) that the moves (e.g., pushes, processes) an error associated with the set of circuit elements to an out-of-band portion (e.g., a portion where distortion may be tolerated in a particular application) of a frequency spectrum of the signal.

Examples of various aspects and trade-offs associated with an example DEM DEM algorithm are described below in connection with FIGS. 6A through 11C. FIGS. 6A through 11C collectively illustrate that a first DEM algorithm (e.g., a first mode of a DEM equation) desirable in scenarios where a lower amplitude signal is involved (and sub-harmonic tones may be tolerated) and a second DEM (e.g., a second mode of a DEM equation) can be desirable when a higher amplitude signal is involved (and higher noise floor may be tolerated). The examples and descriptions associated with FIGS. 6A through 11C are based on an assumption of 0.1% mismatch between circuit elements using for processing by the DEM algorithms.

FIGS. 6A and 6B are graphs that illustrate the behavior of an example DEM algorithm. In each of the graphs, the output signal (e.g., a DAC output signal) in decibels (dB) is shown on the y-axis and a frequency (e.g., $F_s$*6.144 MHz) is shown on the x-axis. In some implementations, the output signal can be an output of a modulator (e.g., modulator 412 shown in FIG. 4, a delta-sigma modulator).

The example DEM algorithm can be a Data Weighted Averaging (DWA) DEM algorithm (referred to as the DWA algorithm), which is represented by DEM Equation 1 below:

$$H_{mismatch} = 1 - z^{-D} \qquad (1)$$

where D can have any value. In some implementations, D can have a maximum of value of 2. DEM Equation 1 is a transfer function that can be used to process the mismatch error of the circuit elements (e.g., circuit elements 140). DEM Equation 1 can be used as a first DEM algorithm when D=1 (e.g., first order DEM algorithm, first mode of a DEM algorithm) and DEM Equation 1 can be used as a second DEM algorithm when D=2 (e.g., second order DEM algorithm, second mode of a DEM algorithm).

The shaping characteristics of DEM Equation 1 when D=1 is shown in FIG. 6A and the shaping characteristics of DEM Equation 1 when D=2 is shown in FIG. 6B. The function $H_{mismatch}$ moves (e.g., pushes) mismatch error of circuit elements out of a target band (e.g., band of interest). The target band of interest in this implementation is generally below, for example, $F_s/128$ (on the far left of each of the graphs). Accordingly, the $H_{mismatch}$ moves (e.g., pushes) mismatch error of circuit elements to the right in the graphs. If in an audio signal processing context, the target band can be a target audio band.

Figure 7A:
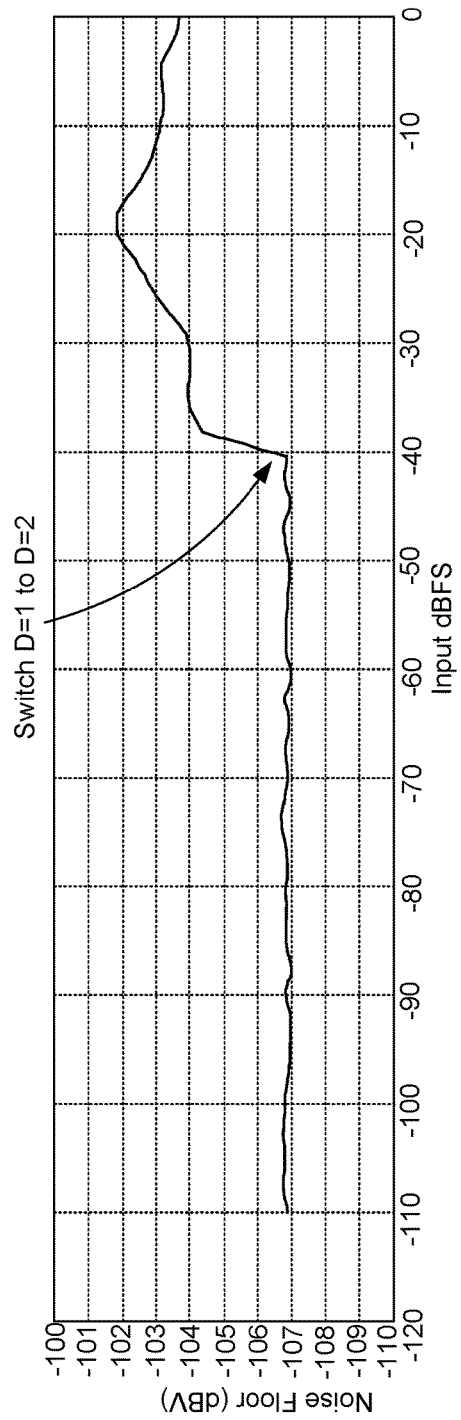
FIGS. 7A and 7B are graphs that illustrate the effect on a signal of switching between DEM algorithms.
Figure 7B:
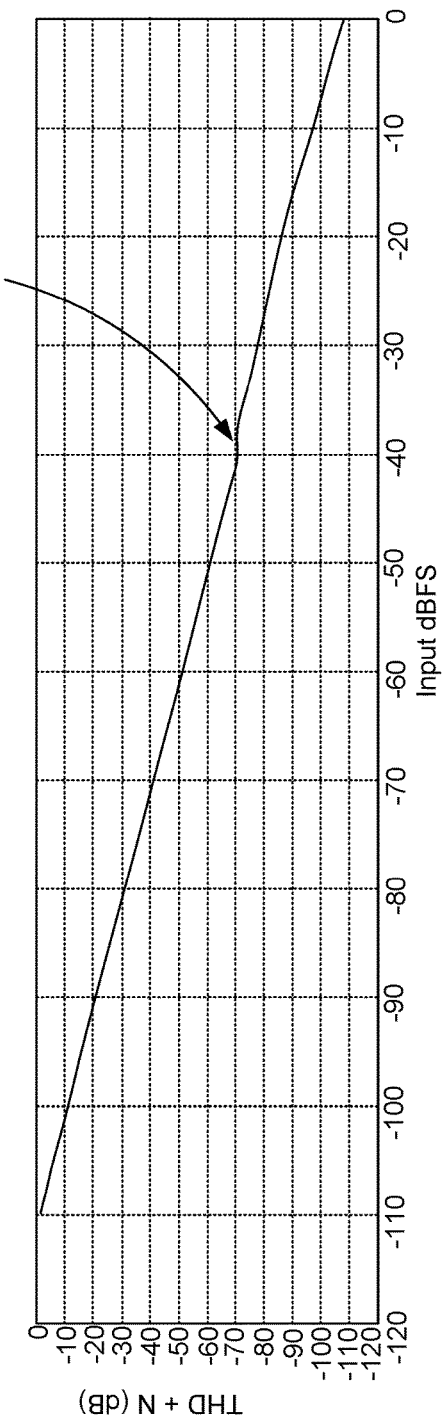

FIGS. 7A and 7B are graphs that illustrate the effect on a signal (e.g., an input signal) of switching between DEM algorithms. Specifically, FIGS. 7A and 7B illustrate switching between D=1 and D=2 of the DEM algorithm represented by DEM Equation 1 and the trade-offs associated with the switching point. FIG. 7A illustrates a noise floor in dBV versus input signal (e.g., digital input signal) in dBFS (decibels full scale), and FIG. 7B illustrates a total harmonic distortion (THD) and noise (N) in dB versus the input signal (shown in FIG. 7A). The switching between D=1 and D=2 is illustrated at approximately −40 dBFS in both graphs.

FIG. 7A shows that at lower signal levels (e.g., signal amplitudes) (left side of the graph where D=1) that the noise floor is lower (with better performance) than at higher signal levels (right side of the graph where D=2). The noise floor measurements can be performed at a low signal, for example, digital silence (ZERO input), at −60 dBFS input, etc. The noise floor of the passband can be evaluated under these conditions.

FIG. 7B, illustrates that the THD+N decreases as the signal level increases. The THD+N can be evaluated at significantly higher signal levels, for example, in the range of −20 dBFS to 0 dBFS. In this case, harmonics of the input signal would be expected but little to no sub-harmonic tones (or spikes) may be visible. Graphs illustrating the undesirable sub-harmonic tones are shown and described in connection with at least FIGS. 8 through 9B.

Using these relationships shown in FIGS. 7A and 7B, the DEM order can be selected and changed based on the input signal level. This can result in desirable noise floor measurements at lower signal levels with little or no sub-harmonic tones at higher signal levels. As an example, the switching point can be included in, for example, one or more of the conditions (e.g., conditions 12 shown in FIG. 1) and can be used to trigger switching between D=1 and D=2 of the DEM Equation 1.

Figure 8:
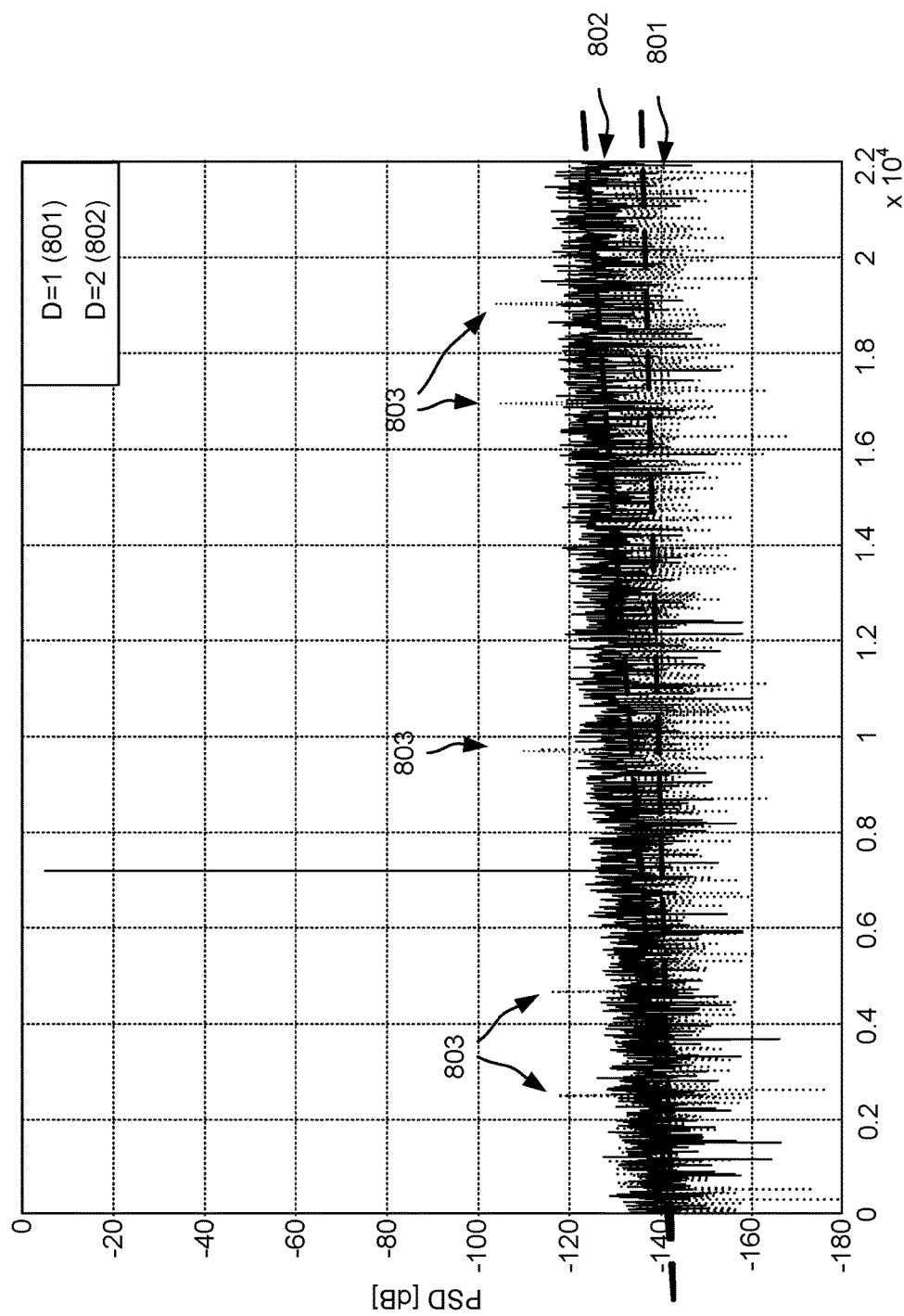
FIG. 8 is a diagram that illustrates power spectral density versus frequency for a model of a device implementing multiple version of a DEM algorithm.

FIG. 8 is a diagram that illustrates power spectral density (PSD) (dB) versus frequency (Hz) for a model of a device implementing multiple version of a DEM algorithm. In this implementation, the results of the DEM algorithm are compared for DEM Equation 1 where D=1 (data 801) and D=2 (data 802). A comparison of the performance of the DEM Equation 1 at the same higher power levels (7.2 kHz) for both D=1 and D=2 illustrates that the DEM Equation 1 where D=2 eliminates the sub-harmonic tones 803 (e.g., tones within the passband are eliminated), which is a significant improvement over the DEM algorithm where D=1. The sub-harmonic tones (e.g., spikes) 803 are associated only with the DEM algorithm where D=1. However, the trade-off with use of the DEM Equation 1 where D=2 is that the integrated noise floor is higher than with the use of DEM Equation 1 where D=1. The difference in integrated noise floor is illustrated by the difference in the slope between the dashed lines through data 801 and data 802. In some implementations, where high signal is, for example, on the order of −14 dBFS, harmonics in the additional amplification stages can dominate performance.

In some implementations, a DEM processor (e.g., DEM processor 120) can be configured to select a DEM algorithm configuration that takes advantage of the trade-offs such as those illustrated in FIG. 8. For example, the DEM Equation where D=1 can be used when a lower amplitude signal is involved (and sub-harmonic tones may be tolerated) and the DEM Equation where D=2 can be used when a higher amplitude signal is involved (and higher noise floor may be tolerated). In the audio context, for example, dynamic range can be one of the key specifications for an audio amplifier. The selection of the DEM Equation (D=1 and D=2), as described herein, can allow for increased dynamic range performance as measured under low signal conditions and can allow for tone free noise floor at higher signal level.

Figure 9A:
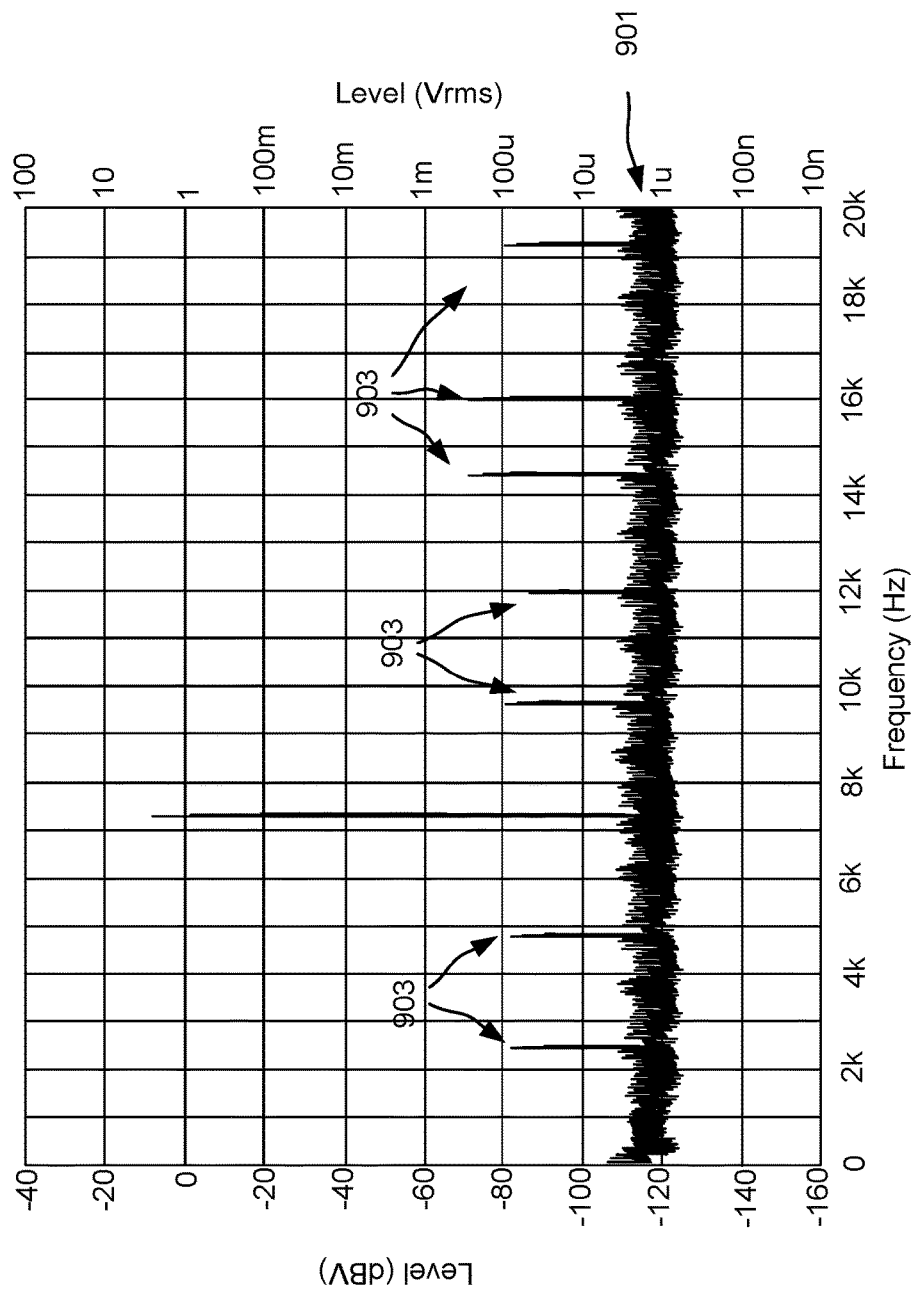
FIGS. 9A and 9B are graphs that further support the results illustrated in FIG. 8.
Figure 9B:
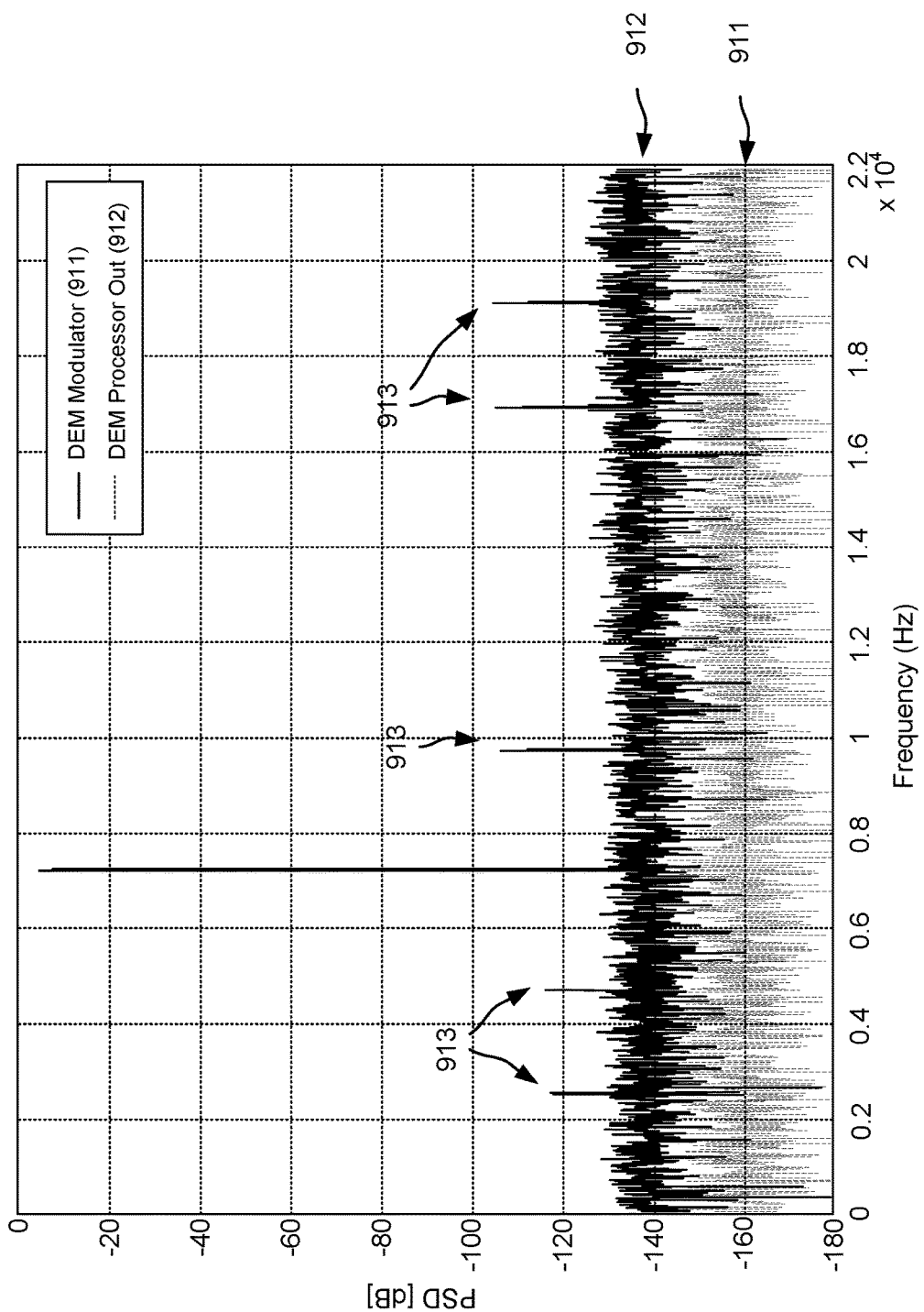

FIGS. 9A and 9B are graphs that further support the results illustrated in FIG. 8. FIG. 9A is a graph that illustrates a fast fourier transform (FFT) spectrum for evaluation of a sample device implementation using a DEM algorithm (DEM Equation 1 where D=1). Data associated with a 7.2 kHz signal (data 901) is shown in FIG. 9A. FIG. 9B is a diagram that illustrates power spectral density (PSD) (dB) versus frequency (Hz) for a model of the device implementation using a DEM algorithm (DEM Equation 1 where D=1) at a high signal level (7.2 kHz in this implementation). An output of a digital modulator 911 (e.g., delta sigma modulator (e.g., modulator 412)) and an output of a DEM processor 912 (e.g., DEM processor 120) are illustrated in this graph. As shown in both FIGS. 9A and 9B, sub-harmonic tones (or spikes) (labeled as 903 in FIGS. 9A and 913 in FIG. 9B) are manifested in the measurements. Tonal behavior, especially sub-fundamental tones, can be undesirable in the system. Undesirable tones are not manifested in the output of the digital modulator 911. In some implementations, sub-harmonic tone generation is a function, at least to some extent, of input signal frequency and amplitude.

Figure 10A:
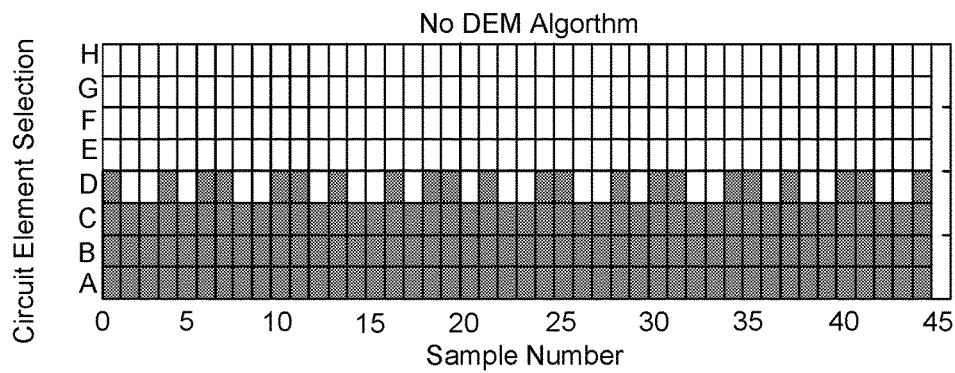
FIGS. 10A through 10C illustrate circuit element selection for variations of a DEM algorithm.
Figure 10B:
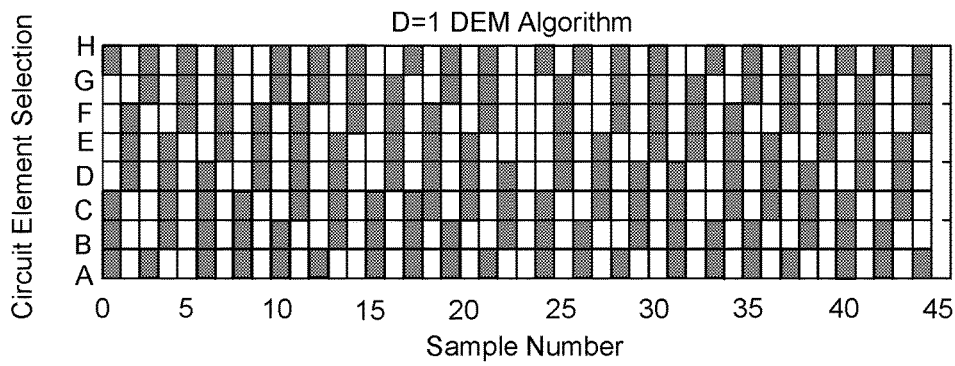
Figure 10C:
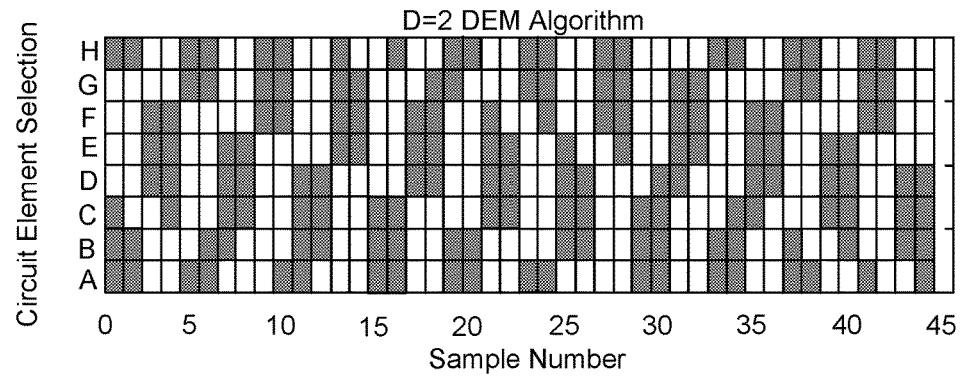

FIGS. 10A through 10C illustrate circuit element selection for variations of a DEM algorithm. Specifically, FIGS. 10A through 10C illustrate circuit element selection for no DEM algorithm, the DEM Equation where D=1, and the DEM Equation where D=2, respectively. The circuit elements are labeled from A through H and the sample numbers increase to the right from 1 to 44 (e.g., increase with time from left to right).

The number of circuit elements selected for a particular sample number is the same across each of FIGS. 10A through 10C to illustrate the differences when there is no DEM algorithm, when D=1 for DEM Equation 1, and D=2 for DEM Equation 1. The number of circuit elements selected at a sample number can be the number of circuit elements need at a particular sampling time. In this example, the circuit element selection toggles between 3 and 4 circuit elements at each of the sample numbers. For example, at sample number 1, a total of 4 circuit elements are selected. As another example, at sample number 9, a total of 3 circuit elements are selected.

As show in FIG. 10A, circuit elements E through H are unused when there is no DEM algorithm applied. For example, at sample number 1, circuit elements A through D are selected, and at sample number 2 circuit elements A through C are selected.

As show in FIG. 10B, when D=1, all of the circuit elements are used. For example, at sample number 1, circuit elements A, B, C, and H are selected; at sample number 2 circuit elements D through F are selected; and at sample number 3 circuit elements A, G and H are selected.

As show in FIG. 10C, when D=2, all of the circuit elements are used, but the pattern of use is different than shown in FIG. 10B when D=1. For example, at sample number 1, circuit elements A, B, C, and H are selected (which is the same as shown in FIG. 10B); at sample number 2 circuit elements A, B, and H are selected (which is different than shown in FIG. 10B); and at sample number 3 circuit elements D through F are selected (which is different than shown in FIG. 10B).

FIGS. 10B through 10C, in particular, illustrate the different ways in which DEM algorithms can select circuit elements (e.g., select circuit elements in a particular pattern or order over time) to process a signal over time.

Figure 11A:
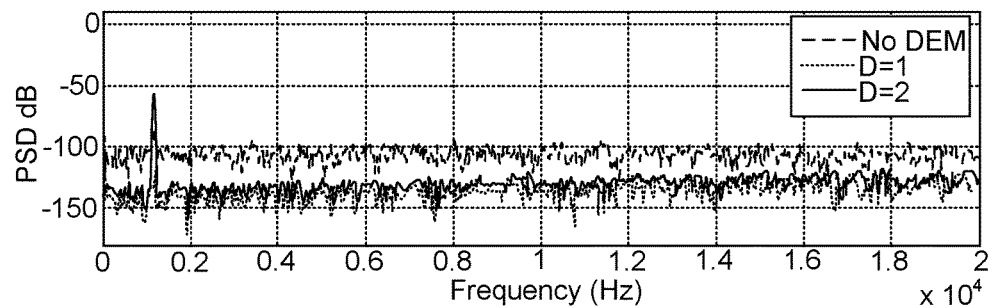
FIGS. 11A through 11C illustrate various parameters that are affected by the implementations shown in FIGS. 10A through 10C.
Figure 11B:
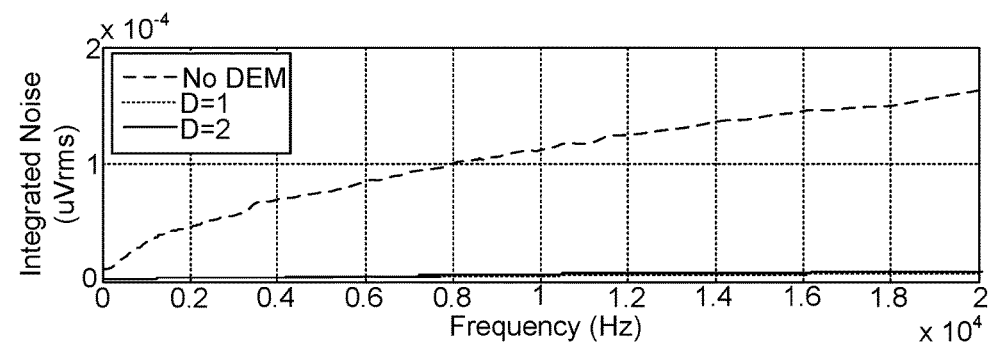
Figure 11C:
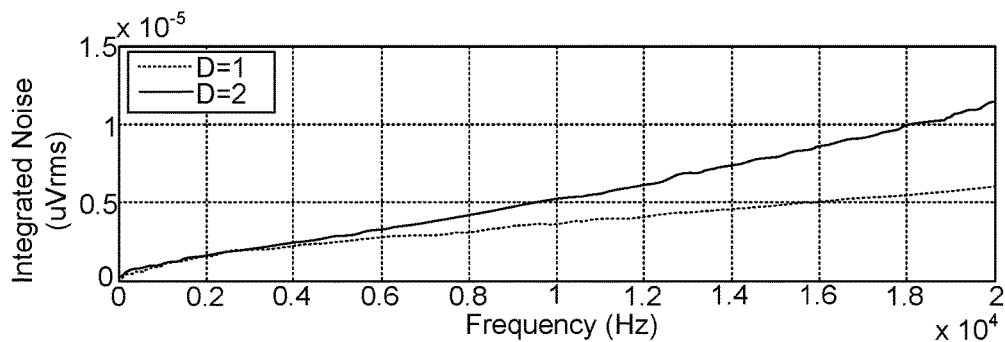

FIGS. 11A through 11C illustrate various parameters that are affected by the implementations shown in FIGS. 10A through 10C. FIG. 11A illustrates the PSD for no DEM algorithm compared with the DEM Equation where D=1, and the DEM Equation where D=2. FIG. 11B illustrates the integrated noise floor for no DEM algorithm compared with the DEM Equation where D=1, and the DEM Equation where D=2. FIG. 11C is a scaled version of the graph shown in FIG. 11B to highlight the differences between the integrated noise floor for the DEM Equation where D=1 and the DEM Equation where D=2.

As shown in this figures, the integrated noise floor for no DEM is much higher than for D=1 and D=2. The integrated noise floor for D=2 is slightly higher than for D=1, which is consistent with the graphs described above. No DEM processing has detrimental mismatch effects, with a very high noise floor. Both the D=1 and D=2 algorithms are desirable for reducing (or eliminating) in-band mismatch noise. The D=1 case has better noise floor performance with a small signal applied with around 3 dB noise floor improvement over D=2.

In one general aspect, an apparatus can include a signal analyzer configured to analyze a signal associated with a processing pipeline, and a dynamic element matching (DEM) selection module configured to select a DEM algorithm from a plurality of DEM algorithms based on the analysis performed by the signal analyzer. The apparatus can include a set of circuit elements, where each circuit element from the set of circuit elements can have the same logical configuration. The apparatus can include a circuit element selection module configured to select a subset of the set of circuit elements based on the selected DEM algorithm. The apparatus can include a combination of any of the following.

In some implementations, the DEM algorithm is a first DEM algorithm, the signal analyzer analyzes the signal at a first time. The signal analyzer can be further configured to analyze the signal at a second time, and the DEM selection module is further configured to select a second DEM algorithm based on the analysis of the signal at the second time. In some implementations, the subset is a first subset, and the circuit element selection module can be configured to select a second subset of the set of circuit elements based on the second DEM algorithm. In some implementations, the signal analyzer is configured to analyze at least one of a signal level or a signal frequency of the signal.

In some implementations, the DEM selection module is configured to select the DEM algorithm based on the analysis of the signal and a condition stored in a memory. In some implementations, the apparatus can include a digital signal processor, and at least one of the signal analyzer or the DEM selection module can be included in the digital signal processor. In some implementations, the apparatus can include a digital-to-analog converter (DAC) processing pipeline, and the set of circuit elements can be included in the DAC processing pipeline.

In some implementations, the signal is an input analog signal and the signal analyzer is configured to analyze the input analog signal. The apparatus can include a digital-to-analog converter (DAC) configured to produce an output digital signal using the selected subset of circuit elements. In some implementations, at least one of the circuit elements includes a current source. In some implementations, each the circuit element from the set of circuit elements is identical in configuration.

In yet another aspect, an apparatus can include a set of circuit elements, each circuit element from the set of circuit elements having the same configuration for processing signals, and a dynamic element matching (DEM) processor configured to use the set of circuit elements based on a first DEM algorithm. The apparatus can include a signal analyzer configured to analyze a signal, and a dynamic element matching (DEM) selection module configured to select a second DEM algorithm from a plurality of DEM algorithms based on the analysis performed by the signal analyzer. The second DEM algorithm can be different from the first DEM algorithm. The apparatus can include a combination of any of the following.

In some implementations, the apparatus can include a circuit element selection module configured to select a subset of the set of circuit elements based on the second DEM algorithm. In some implementations, the DEM selection module can be configured to select the second DEM algorithm based on the analysis of the signal and a statistical condition.

In yet another general aspect, a method can include analyzing, during a first time period, a signal associated with a processing pipeline at a signal analyzer, selecting a first DEM algorithm from a plurality of DEM algorithms based on the analysis during the first time period and a statistical condition, and selecting a subset of a set of circuit elements based on the selected DEM algorithm. The method can include analyzing, during a second time period, the signal associated with the processing pipeline at the signal analyzer, and selecting a second DEM algorithm from the plurality of DEM algorithms based on the analysis during the second time period and the statistical condition. The apparatus can include a combination of any of the following.

In some implementations, the signal is a feedforward signal associated with an input side of the processing pipeline. In some implementations, the signal is a feedback signal associated with an output side of the processing pipeline. In some implementations, the first DEM algorithm is an equation the moves an error associated with the set of circuit elements to an out-of-band portion of a frequency spectrum of the signal. In some implementations, the analyzing includes analyzing at least one of a signal level or a signal frequency of the signal, the selecting can include modifying a subset of a set of circuit elements in accordance with a pattern based on the selected DEM algorithm. In some implementations, the signal is an input analog signal. The method can include producing an output digital signal using the selected subset of circuit elements. In some implementations, the selecting the first DEM algorithm includes selecting during the first time period.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
a signal analyzer configured to analyze a signal associated with a processing pipeline;
a dynamic element matching (DEM) selection module configured to select a DEM algorithm from a plurality of DEM algorithms based on the analysis performed by the signal analyzer;
a set of circuit elements included in the processing pipeline, each circuit element from the set of circuit elements having an identical configuration; and
a circuit element selection module configured to select a subset of the set of circuit elements based on the selected DEM algorithm.

2. The apparatus of claim 1, wherein the DEM algorithm is a first DEM algorithm, the signal analyzer analyzes the signal at a first time,
the signal analyzer is further configured to analyze the signal at a second time,
the DEM selection module is further configured to select a second DEM algorithm based on the analysis of the signal at the second time.

3. The apparatus of claim 2, wherein the subset is a first subset, the circuit element selection module configured to select a second subset of the set of circuit elements based on the second DEM algorithm.

4. The apparatus of claim 1, wherein the signal analyzer is configured to analyze at least one of a signal level or a signal frequency of the signal.

5. The apparatus of claim 1, wherein the DEM selection module is configured to select the DEM algorithm based on the analysis of the signal and a condition stored in a memory.

6. The apparatus of claim 1, further comprising:
a digital signal processor, at least one of the signal analyzer or the DEM selection module being included in the digital signal processor.

7. The apparatus of claim 1, further comprising:
a digital-to-analog converter (DAC) processing pipeline, the set of circuit elements being included in the DAC processing pipeline.

8. The apparatus of claim 1, wherein the signal is an input analog signal and the signal analyzer is configured to analyze the input analog signal,
the apparatus further comprising:

a digital-to-analog converter (DAC) configured to produce an output digital signal using the selected subset of circuit elements.

9. The apparatus of claim 1, wherein at least one of the circuit elements includes a current source.

10. An apparatus, comprising:
a set of circuit elements, each circuit element from the set of circuit elements having the same configuration for processing signals;
a dynamic element matching (DEM) processor configured to use the set of circuit elements based on a first DEM algorithm;
a signal analyzer configured to analyze a signal; and
a dynamic element matching (DEM) selection module configured to select a second DEM algorithm from a plurality of DEM algorithms based on the analysis performed by the signal analyzer and a statistical condition, the second DEM algorithm being different from the first DEM algorithm.

11. The apparatus of claim 10, further comprising:
a circuit element selection module configured to select a subset of the set of circuit elements based on the second DEM algorithm.

12. A method, comprising:
analyzing, during a first time period, a signal associated with a processing pipeline at a signal analyzer;
selecting a first DEM algorithm from a plurality of DEM algorithms based on the analysis during the first time period and a statistical condition;
selecting a subset of a set of circuit elements based on the selected first DEM algorithm, the selecting includes modifying a subset of a set of circuit elements in accordance with a pattern based on the selected DEM algorithm;
analyzing, during a second time period, the signal associated with the processing pipeline at the signal analyzer, the analyzing includes analyzing at least one of a signal level or a signal frequency of the signal; and
selecting a second DEM algorithm from the plurality of DEM algorithms based on the analysis during the second time period and the statistical condition.

13. The method of claim 12, wherein the signal is a feedforward signal associated with an input side of the processing pipeline.

14. The method of claim 12, wherein the signal is a feedback signal associated with an output side of the processing pipeline.

15. A method, comprising:
analyzing, during a first time period, a signal associated with a processing pipeline at a signal analyzer;
selecting a first DEM algorithm from a plurality of DEM algorithms based on the analysis during the first time period and a statistical condition;
selecting a subset of a set of circuit elements based on the selected first DEM algorithm, the first DEM algorithm being an equation that moves an error associated with the set of circuit elements to an out-of-band portion of a frequency spectrum of the signal;
analyzing, during a second time period, the signal associated with the processing pipeline at the signal analyzer; and
selecting a second DEM algorithm from the plurality of DEM algorithms based on the analysis during the second time period and the statistical condition.

16. The method of claim 12, wherein the signal is an input analog signal,
the method further comprising:

producing an output digital signal using the selected subset of circuit elements.

17. The method of claim 12, the selecting the first DEM algorithm includes selecting during the first time period.

18. The apparatus of claim 1, wherein the signal is a feedforward signal associated with an input side of the processing pipeline or feedback signal associated with an output side of the processing pipeline.

19. The method of claim 15, wherein the signal is a feedforward signal associated with an input side of the processing pipeline or feedback signal associated with an output side of the processing pipeline.

* * * * *